United States Patent [19]

Hanson

[11] Patent Number: 4,570,056
[45] Date of Patent: Feb. 11, 1986

[54] AUTOMATICALLY ADAPTABLE RADIX CONVERSION SYSTEM FOR USE WITH VARIABLE LENGTH INPUT NUMBERS

[75] Inventor: Lawrence G. Hanson, Temple City, Calif.

[73] Assignee: Burroughs Corporation, Detroit, Mich.

[21] Appl. No.: 494,496

[22] Filed: May 17, 1983

Related U.S. Application Data

[63] Continuation of Ser. No. 192,229, Sep. 30, 1980, Pat. No. 4,342,027.

[51] Int. Cl.[4] ........................................... H03K 13/24
[52] U.S. Cl. .............................. 235/311; 340/347 DD
[58] Field of Search ................ 340/347 DD; 235/310, 235/311

[56] References Cited

U.S. PATENT DOCUMENTS

3,700,872 10/1972 May ..................................... 235/311
3,736,412 5/1973 Wright ................................ 235/311
3,748,450 7/1973 Fico .................................... 235/311

OTHER PUBLICATIONS

Lee "IBM Technical Disclosure Bulletin", vol. 16, No. 1, Jun. 1973, pp. 288-289.

Primary Examiner—Charles D. Miller
Attorney, Agent, or Firm—Nathan Cass; Kevin R. Peterson

[57] ABSTRACT

Automatically adaptable radix conversion apparatus which provides for radix conversion of an input number by successive serial division using look-up tables contained in a programmable read only memory (PROM). The particular conversion performed is automatically determined in response to input control information provided along with the input number which is used to select the appropriate set of tables in the PROM applicable to the particular conversion desired. The input control information is also used by the apparatus to permit it to automatically adjust to handle variable input number lengths and also to automatically terminate the conversion operation after operations on the last digit of the input number have been completed.

9 Claims, 13 Drawing Figures

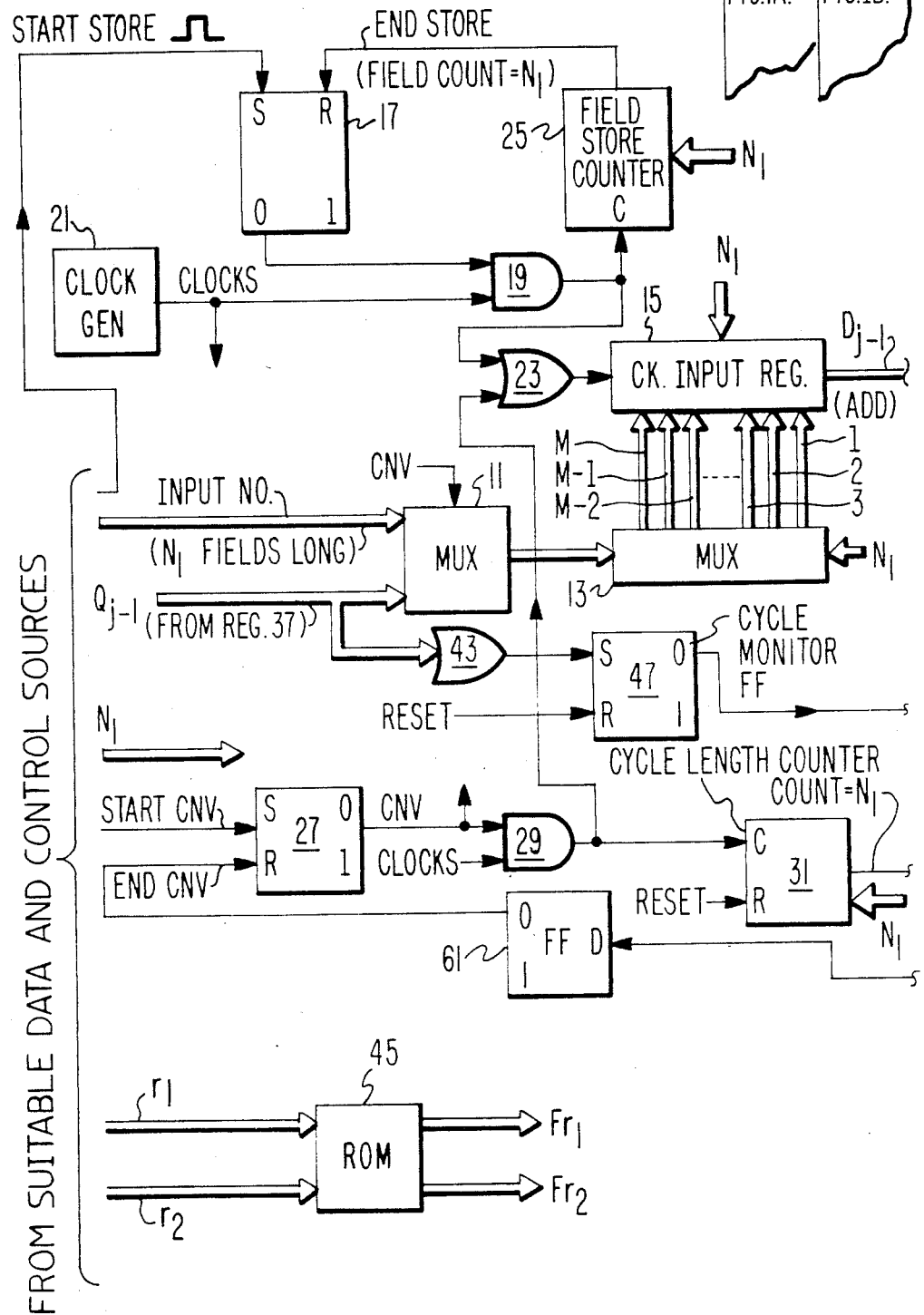
FIG.1A.
FIG.1.
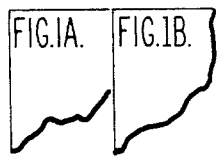

BCD (1389₁₀)-TO-BINARY CHART

| CYCLE | CYCLE CLOCK | INPUT REG.15 → | PROM 33 INPUT | | | PROM 33 OUTPUT | | | OUTPUT REG. 41 → |
|---|---|---|---|---|---|---|---|---|---|
| | | | $R_{j-1_0}$ | $D_{j-1}$ | | $Q_{j_0}$ | $R_{j_0}$ | $Q_{j-1_0}$ | |
| 0 | 0 | 1389 | | | | | | | |
| | 0 | 1389 | 0 | 1 | | 0 | 1 | 0 | 00000000000 |
| 1 | 1 | 3890 | 1 | 3 | | 6 | 1 | 0 | |
| | 2 | 8900 | 1 | 8 | | 9 | 0 | 6 | |
| | 3 | 9006 | 0 | 9 | | 4 | 1 | 9 | |
| | 4 | 0069 | ☐1 | 0 | | 5 | 0 | 4 | |
| | 5 | 0694 | 0 | 0 | | 0 | 0 | 0 | 10000000000 |
| 2 | 1 | 6940 | 0 | 6 | | 3 | 0 | 0 | |
| | 2 | 9400 | 0 | 9 | | 4 | 1 | 3 | |
| | 3 | 4003 | 1 | 4 | | 7 | 0 | 4 | |
| | 4 | 0034 | ☐0 | 0 | | 0 | 0 | 7 | |
| | 5 | 0347 | 0 | 0 | | 0 | 0 | 0 | 01000000000 |
| 3 | 1 | 3470 | 0 | 3 | | 1 | 1 | 0 | |

←——————— CNV ———————→

FIG.2B.

| CNV | | | | | | | |
|---|---|---|---|---|---|---|---|
| 3 | 2 | 4700 | 1 | -1 | 4 | 7 | 0 | |
|   | 3 | 7001 | 0 | 0 | 7 | 3 | 1 | |
|   | 4 | 0017 | [1] | 0 | 0 | 5 | 0 | |
|   | 5 | 0000 | 0 | 0 | 0 | 0 | 0 | |
| 4 | 1 | 1730 | 0 | 1 | 0 | 0 | 0 | 10100000000 |
|   | 2 | 7300 | 1 | 7 | 8 | 0 | 0 |
|   | 3 | 3000 | 1 | 3 | 6 | 8 | 0 |
|   | 4 | 0008 | [1] | 0 | 5 | 6 | 6 |
|   | 5 | 0086 | 0 | 0 | 0 | 0 | 0 |
| 5 | 1 | 0860 | 0 | 0 | 0 | 0 | 0 | 11010000000 |
|   | 2 | 8600 | 0 | 8 | 4 | 0 | 0 |
|   | 3 | 6000 | 0 | 6 | 3 | 0 | 4 |
|   | 4 | 0004 | [0] | 0 | 0 | 3 | 3 |
|   | 5 | 0043 | 0 | 0 | 0 | 0 | 0 |
| 6 | 1 | 0430 | 0 | 0 | 0 | 0 | 0 | 01101000000 |
|   | 2 | 4300 | 0 | 4 | 2 | 0 | 0 |

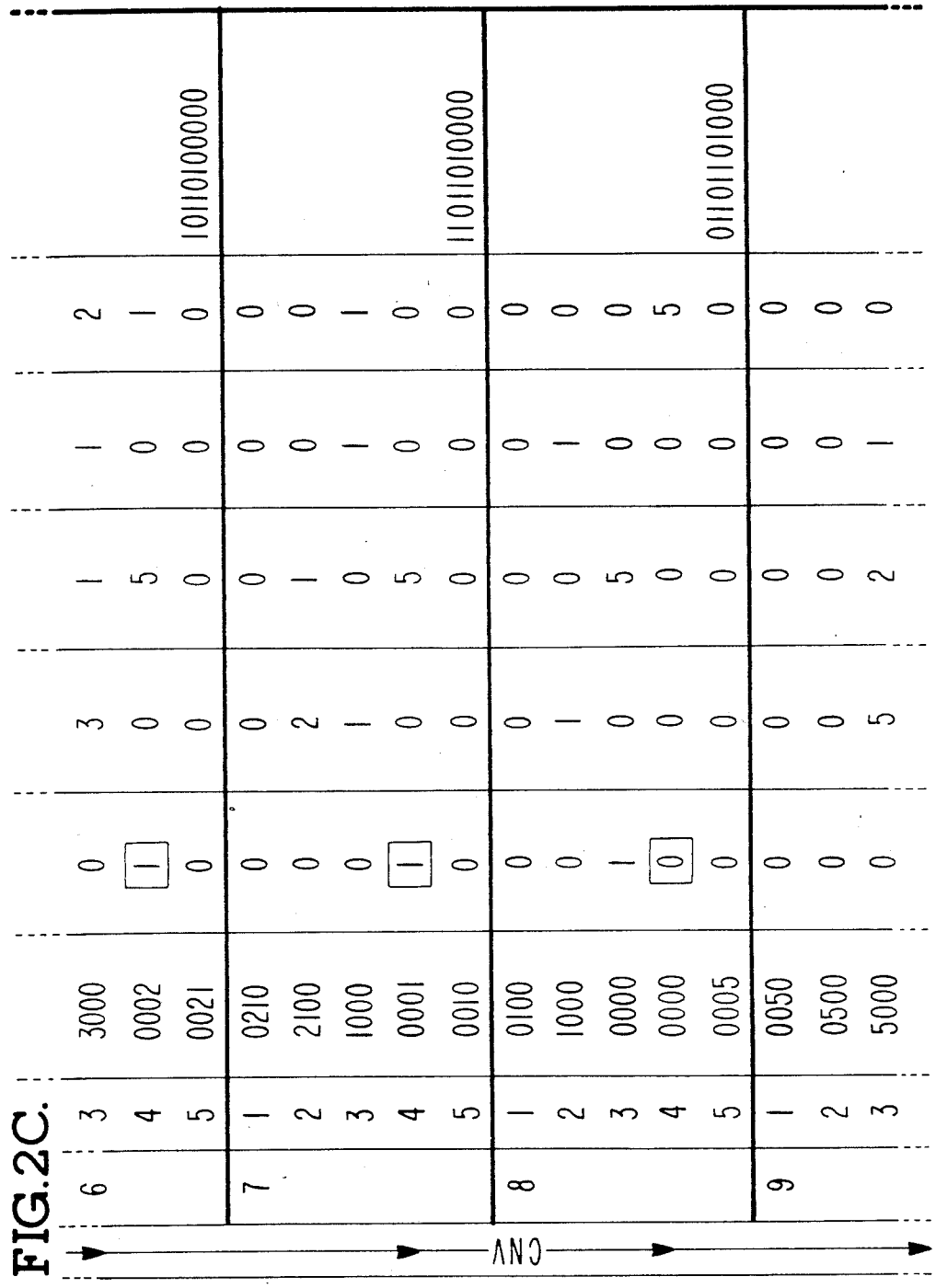

BINARY ($10101101101_2$)-TO-BCD CHART

| CYCLE | CYCLE CLOCK | INPUT REG. 15 | PROM 33 INPUT | | PROM 33 OUTPUT | | | OUTPUT REG. 41 |
|---|---|---|---|---|---|---|---|---|
| | | | $R_{j-1}$ | $D_{j-1}$ | $Q_j$ | $R_j$ | $Q_{j-1}$ | |
| 0 | 0 | 10101101101 | 0 | | | | | 0000 |
| | 1 | 01011011010 | 1 | 1 | 0 | 1 | 0 | |
| | 2 | 10110110100 | 2 | 0 | 0 | 2 | 0 | |
| | 3 | 01101101000 | 5 | 1 | 0 | 5 | 0 | |
| | 4 | 11011010000 | 0 | 0 | 1 | 0 | 0 | |
| | 5 | 10110100001 | 1 | 1 | 0 | 1 | 1 | |
| | 6 | 01101000010 | 3 | 1 | 0 | 3 | 0 | |
| | 7 | 11010000100 | 6 | 0 | 1 | 6 | 0 | |
| | 8 | 10100001000 | 3 | 1 | 0 | 3 | 0 | |
| | 9 | 01000010001 | 7 | 0 | 1 | 7 | 1 | |
| | 10 | 10000100010 | 4 | 1 | 0 | 4 | 0 | |
| | 11 | 00001000101 | [9] | 0 | 1 | 8 | 1 | |

CNV

FIG.3C.

| 3 | | | | | | | | | | 4 | | | | | |
|---|---|---|---|---|---|---|---|---|---|---|---|---|---|---|---|
| | 4 | 5 | 6 | 7 | 8 | 9 | 10 | 11 | 12 | 1 | 2 | 3 | 4 | 5 | |
| | 00011010000 | 00110100000 | 01101000000 | 11010000000 | 10100000000 | 01000000000 | 10000000000 | 00000000000 | 00000000001 | 00000000010 | 00000000100 | 00000001000 | 00000010000 | 00000100000 | |
| | 0 | 0 | 0 | 0 | 1 | 3 | 6 | [3] | 0 | 0 | 0 | 0 | 0 | 0 | |
| | 0 | 0 | 0 | 1 | 1 | 0 | 1 | 0 | 0 | 0 | 0 | 0 | 0 | 0 | |
| | 0 | 0 | 0 | 0 | 0 | 0 | 1 | 0 | 0 | 0 | 0 | 0 | 0 | 0 | |
| | 0 | 0 | 0 | 1 | 3 | 6 | 3 | 6 | 0 | 0 | 0 | 0 | 0 | 0 | |
| | 0 | 0 | 0 | 0 | 0 | 0 | 0 | 1 | 0 | [0 | 0 | 0 | 0 | 0] | 3890 |

← —— CNV —— →

4,570,056

AUTOMATICALLY ADAPTABLE RADIX CONVERSION SYSTEM FOR USE WITH VARIABLE LENGTH INPUT NUMBERS

CROSS REFERENCE TO RELATED APPLICATIONS

This application is a continuation of paten application Ser. No. 192,229, filed Sept. 30, 1980, now U.S. Pat. No. 4,342,027.

My commonly assigned U.S. patent applications Ser. No. 156,201, filed June 3, 1980, now U.S. Pat. No. 4,342,026, and Ser. No. 174,431, filed Aug. 1, 1980, now U.S. Pat. No. 4,342,027, are directed to related subject matter.

BACKGROUND OF THE INVENTION

1. Field of the Invention

This invention relates to an improved means and methods for converting an input number in a first radix $r_1$ into its equivalent number in another radix $r_2$.

2. Description of the Prior Art

As is well known, digital computers typically require means and methods for converting between different number systems. Conversions between binary coded decimal numbers and binary numbers, and vice versa, are probably the most frequent types of conversions required.

In the binary system of notation, each binary digit (bit) represents a different power of 2. For example, in binary notation, the binary number 11101 is equal to $1 \times 2^4 + 1 \times 2^3 + 1 \times 2^2 + 0 \times 2^1 + 1 \times 2^0 = 29$. In the binary coded decimal (BCD) system of notation, each decimal number is represented by a corresponding binary code of four binary bits. Thus, the above decimal number 29 is represented in BCD notation as 0010 1001 where $0010 = 2$ and $1001 = 9$.

Various known approaches for providing number conversions and, in particular, BCD to binary and/or binary to BCD conversions, are described and referenced in the articles: "A Method for High Speed BCD-to-Binary Conversion", L. C. Beougher, Computer Design, March 1973, pp. 53–59; and "Binary-to-BCD Conversion with Complex IC Functions", J. R. Linford, Computer Design, September 1970, pp. 53–61.

SUMMARY OF THE INVENTION

Briefly an automatically adaptable radix conversion system is provided for converting a variable length input number in a first radix $r_1$ into its equivalent number in another radix $r_2$ using the advantageous serial division conversion approach disclosed in the aforementioned copending patent application Ser. No. 174,431, filed Aug. 1, 1980, now U.S. Pat. No. 4,342,027.

In a preferred embodiment of the invention an input circuit selectively stores consecutive fields of a variable length input number. A conversion circuit is provided for converting the variable length input number into an equivalent number in another radix, the particular radix conversion provided by the conversion circuit being automatically determined in response to control input data provided along with the input number. The system automatically adjusts to handle the input number length and to automatically terminate the conversion operation after the last number of the input number is completed.

The specific nature of the invention, as well as other features, objects, advantages and uses thereof, will become readily evident from the following description of a preferred embodiment taken in conjunction with the accompanying drawings, wherein like reference numerals and designations indicate like or corresponding parts throughout the figures of the drawings.

BRIEF DESCRIPTION OF THE DRAWINGS

FIGS. 1A and 1B when combined as shown in FIG. 1 schematically illustrate a preferred embodiment of the invention.

FIGS. 2A, 2B, 2C and 2D when combined as shown in FIG. 2 constitute a BDC-to-Binary chart illustrating the contents of various components in the preferred embodiment of FIGS. 1A and 1B during the cycle clock periods for eac cycle of operation of an exemplary BDC-to-binary conversion operation.

DESCRIPTION OF THE PREFERRED EMBODIMENT

Before proceeding to a description of a preferred embodiment of the invention, some of the terminology used in the description will first be defined and explained.

An input number, which is to be converted from radix $r_1$ into radix $r_2$, is comprised of one or more fields as a function of the length of the input number. Each field in the input number can be defined as the bit width (coded in binary bits) of the input number, which bit width is determined by the radix $r_1$ in which the input number is expressed.

The general equation (1) for determining the field bit width needed to represent a number in a given radix r is:

$$(\text{field bit width})_r = \lceil \log_2 r \rceil \qquad (1)$$

Equation (1) requires that the log to the base 2 be taken of radix r and that the answer be rounded up to the next higher integer if the answer initially contains a fraction.

By using equation (1) the field bit widths used with some exemplary radices are illustrated in the following Table I.

TABLE I

| Radix r | Field Bit Width |
| --- | --- |
| 2 | 1 |
| 3 or 4 | 2 |
| 5 to 8 | 3 |
| 9 to 16 | 4 |

Thus, for example, if the input number is binary (tertiary, octal or BCD) in form, its radix $r_1 = 2$ (3, 8 or 10) to show that each field requires 2 (3, 8 or 10) states and, therefore, the field width needs to be 1 (2, 3 or 4) bit(s) wide.

To further illustrate the field bit width and field length of an input number, assume that the input number is BCD number $1389_{10}$, or 0001 0011 1000 1001. Thus, the input BCD number $1389_{10}$ would have a field bit width of 4 binary bits and be 4 fields long. Similarly, if the input number were binary number $10101101101_2$, it would have a field bit width of 1 binary bit and be eleven fields long.

Figure 1B:
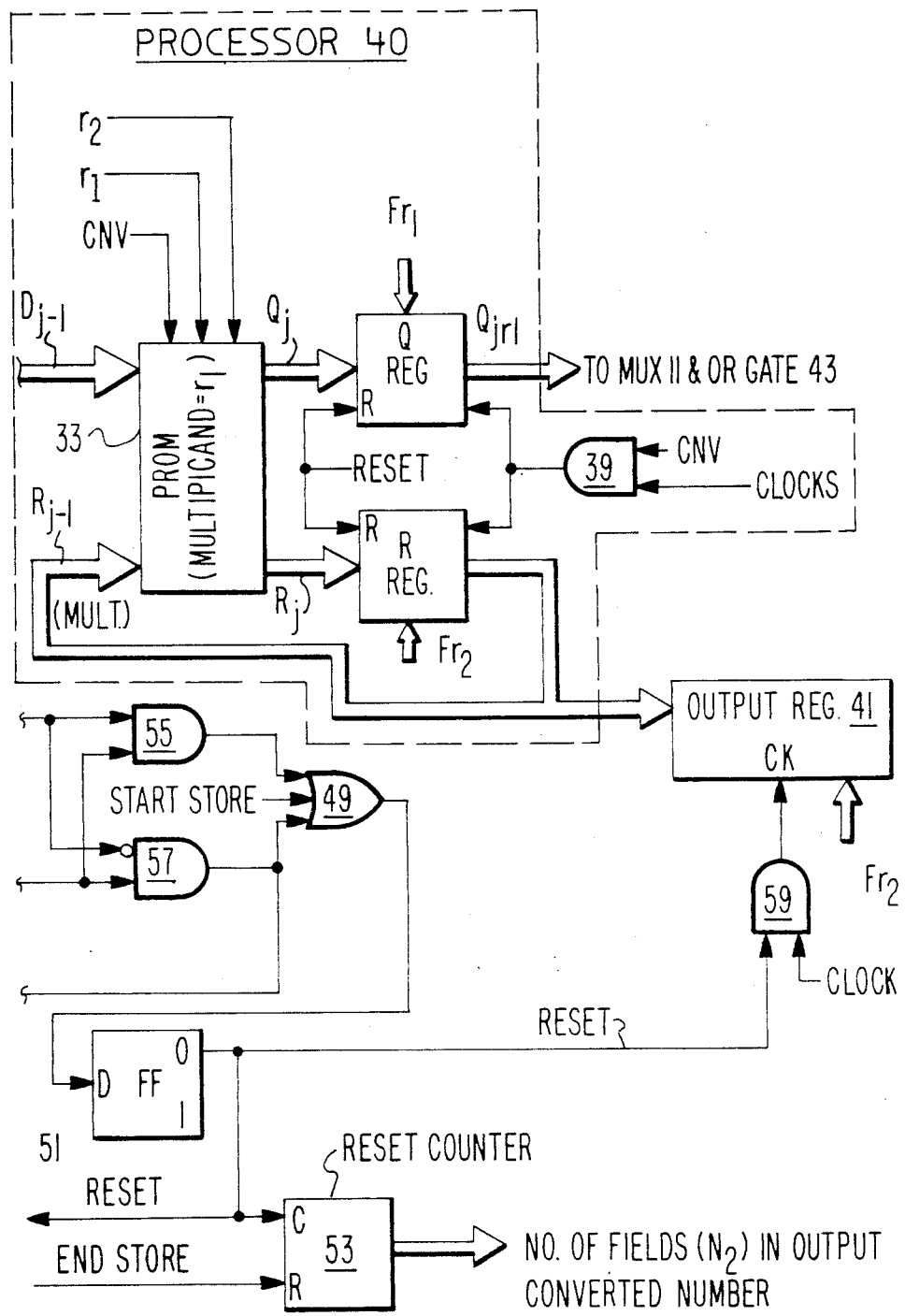
Figures 2, 2A:
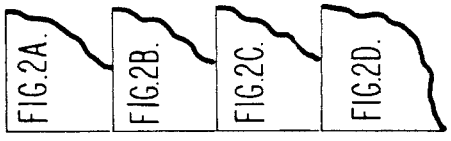
Figure 2D:
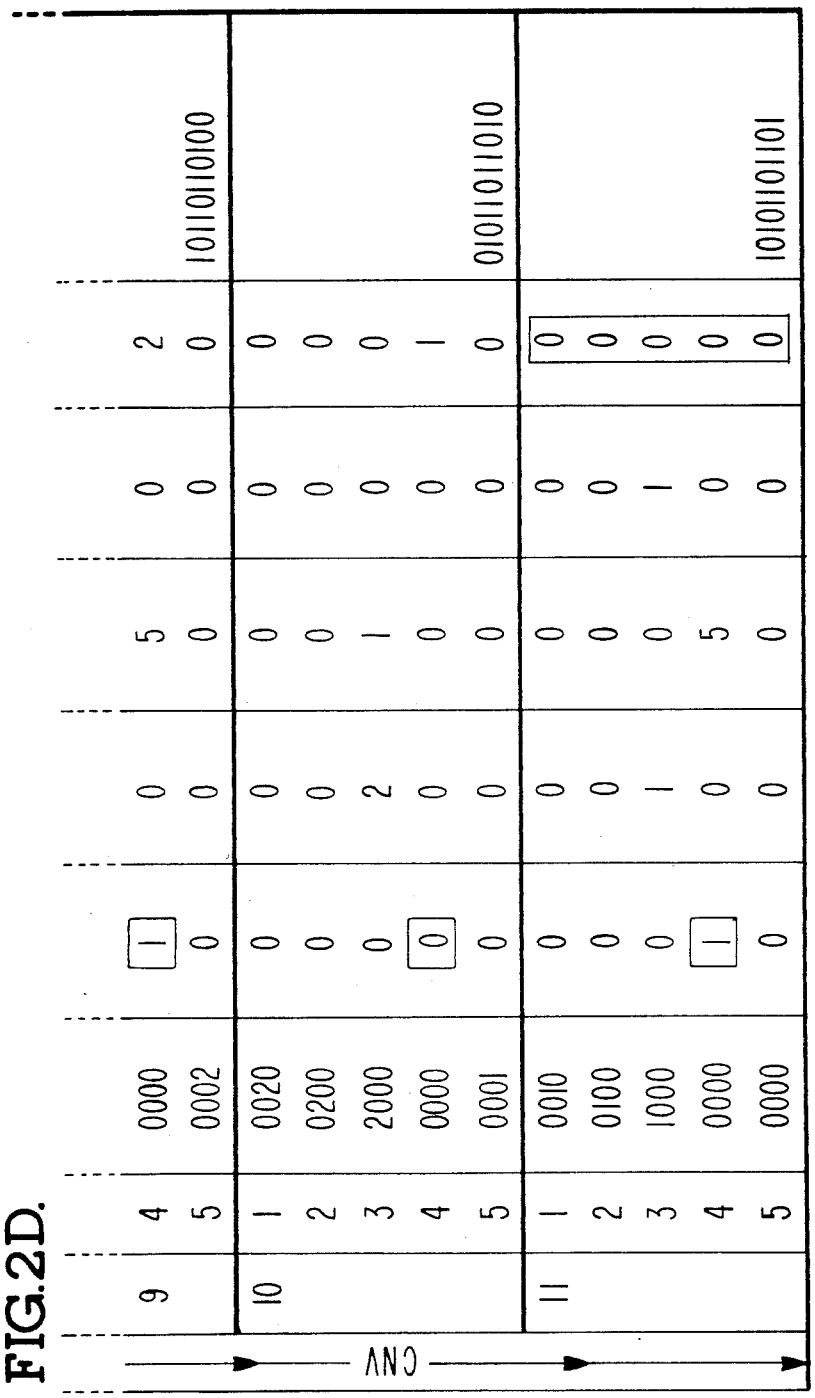
Figures 3, 3A, 3B, 3C, 3D:
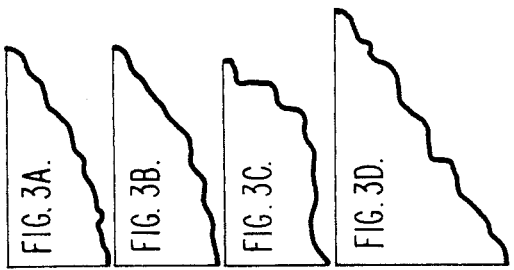
FIGS. 3A, 3B, 3C and 3D when combined as shown in FIG. 3 constitute a Binary-to-BCD chart illustrating the contents of various components in the preferred embodiment of FIGS. 1A and 1B during the cycle clock periods for each cycle of operation of an exemplary binary-to-BCD conversion operation.
Figure 3B:
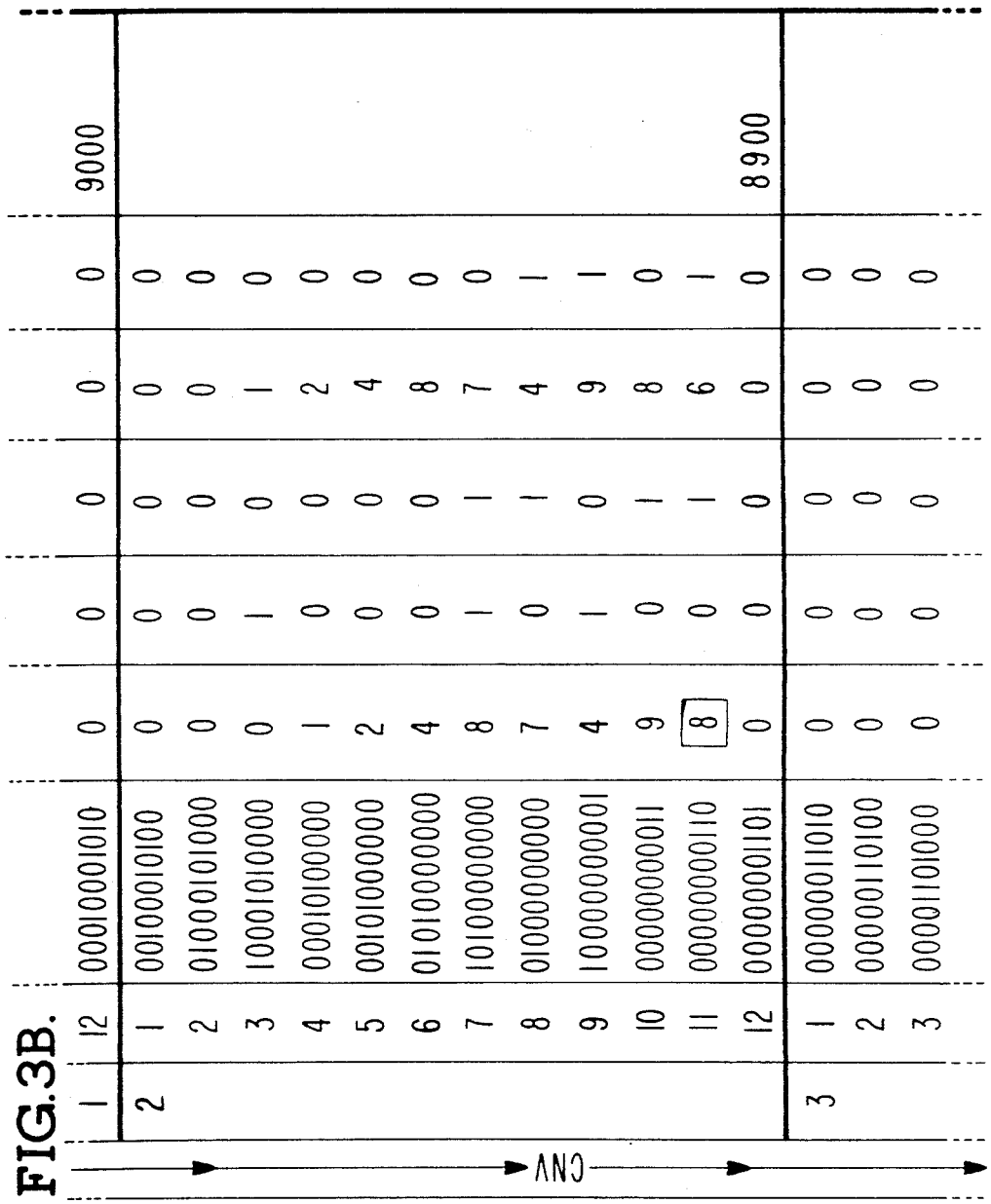
Figure 3D:
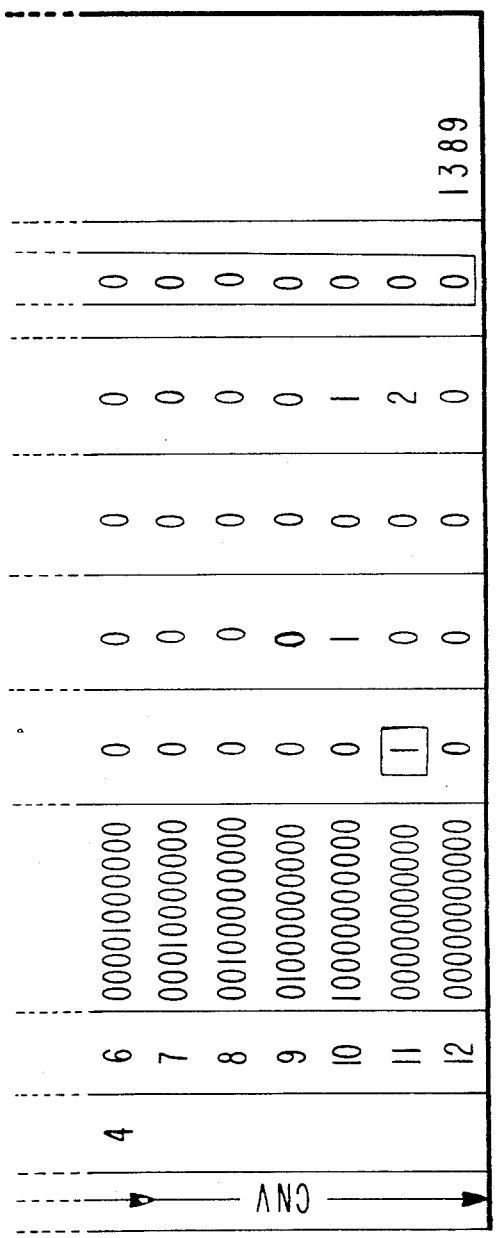

Referring now to the drawings, FIGS. 1A and 1B disclose a schematic block diagram of a preferred embodiment of the invention. In the operation of the system of FIGS. 1A and 1B the input number to be converted is stored during a store operation and converted during a conversion operation.

During the store operation, the input number to be converted, signals $r_1$ and $r_2$ respectively representing the present radix $r_1$ of the input number and the radix $r_2$ into which the input number is to be converted, the signal $N_1$ representing the number of fields in the input number, and a "start store" signal are brought in from suitable data and control sources (not shown). The $r_1$, $r_2$, $N_1$ and "start store" signals are control signals which, as will be explained, are essentially used to prepare various circuits in FIGS. 1A and 1B for the subsequent conversion operation. These control signals can be contained in a microinstruction, initiated by an operator or derived from some other suitable source(s). The control signals $r_1$ and $N_1$ (which pertain to the input number) and $r_2$ (which pertains to the radix of the future-converted output number) are known in advance and can be applied prior to or concurrent with the input number and the "start store" control signal.

The $N_1$ fields in the input number are sequentially applied to the upper input of a multiplexer 11 which is controlled in operation by the state of a CNV (convert) signal. During the store operation, the CNV signal is in a binary 0 state. This 0 state CNV signal enables the multiplexer 11 to pass the sequence of $N_1$ fields of the input number from its upper input to the input of another multiplexer 13, which has M output paths. The number M represents the maximum number of fields that would be encountered in an input number during a desired operation. Multiplexer 13 is controlled by the signal $N_1$ to select whichever path number of its plurality of output paths 1, 2 . . . M that is equal to the number of fields $N_1$ in the input number. For example, if $N_1=4$, output path 4 would be selected.

Each of the 1, 2 . . . M output paths from multiplexer 13 is applied to the input(s) of an associated bank of D-flip-flops (not shown) of an input shift register 15 that is M banks long. The number of D-flip-flops in a bank is equal to the maximum field bit width to be encountered in radix $r_1$ of an input number during a desired operation. The signal $N_1$ is also applied to register 15 to enable only $N_1$ of the M banks in register 15.

While the first one of the $N_1$ fields of the input number is being applied to the upper input of multiplexer 11, the "start store" signal is applied to the set input of an RS flip-flop 17, causing the flip-flop 17 to generate a "store" signal at its "0" output. This "store" signal enables an AND gate 19 to pass clocks from clock generator 21 through OR gate 23 to the clock (ck) input of input register 15. It is these clocks from AND gate 19 which enable the fields of the input number to be initially clocked into the register 15 from the output path of multiplexer 13 that is selected by the $N_1$ signal. Clocks from clock generator 21 are also used by other circuits of FIG. 1, such as registers and flip-flops, for the proper operation of the system of FIGS. 1A and 1B.

The clocks passing through AND gate 19 are also counted by field store counter 25. Also applied to counter 25 is the signal $N_1$ which, it will be recalled, indicates the number of fields in the input number to be converted. When the count of counter 25 reaches $N_1$, the counter 25 generates an "end store" signal which resets flip-flop 17 to terminate the store operation. At this time all of the fields in the input number are stored in the $N_1$ banks of flip-flops in register 15 that were enabled by the $N_1$ signal.

To further illustrate the foregoing description, assume that the input number is the hexadecimal number $56D_{16}$ and that the hexadecimal radix ($r_1=16$) is the largest radix $r_1$ to be operationally encountered. As indicated in Table I above, if $r_1=16$, the field bit width=4. Thus, each enabled bank of D-flip-flops in input shift register 15 would comprise 4 flip-flops in parallel to respectively hold the 4 binary-coded bits in the associated field of the input hexadecimal number $56D_{16}$. Since the hexadecimal number $56D_{16}$ is 3 fields long, $N_1=3$. Thus, the signal $N_1$ would only enable path 3 from multiplexer 13 and banks 3, 2 and 1 (not shown) of input register 15. Furthermore, the signal $N_1$ would terminate the store operation after 3 clock periods. Therefore, during the store operation, the fields 5 (0101), 6 (0110) and D (1101) in the input number $56D_{16}$ would each be sequentially passed through multiplexer 11, through output path 3 of multiplexer 13, and would be clocked into shift register 15 and respectively stored in banks 3, 2 and 1 thereof.

When it is desired to start the conversion operation, a "start CNV" signal is applied to the set (S) input of an RS flip-flop 27. In response to the "start CNV" signal the flip-flop 27 generates a "1" state CNV gate at its "0" output side to enable AND gate 29 to pass clocks from clock generator 21 for the duration of the CNV gate. The 1-state CNV gate also causes the multiplexer 11 to switch over to its lower input.

The clocks from AND gate 29 are counted by a cycle length counter 31 and also passed through OR gate 23 to sequentially shift out the fields stored in the associated banks of input shift register 15. Each field shifted out of register 15 is applied as an input dividend field $D_{j-1}$ to a programmable read-only memory (PROM) 33. Also applied to PROM 33 are the CNV, $r_1$ and $r_2$ signals, as well as a remainder field $R_{j-1}$ from a remainder (R) register 35.

The $D_{j-1}$ and $R_{j-1}$ fields operate together as a composite input address to the PROM 33. The 1-state CNV gate enables the PROM 33 to develop a composite output signal comprised of a quotient field $Q_j$ and a remainder field $R_j$ each time that the PROM 33 is addressed by the composite input fields $D_{j-1}$ and $R_{j-1}$. More specifically, in accordance with the serial division approach described in the aforementioned Ser. No. 174,431, now U.S. Pat. No. 4,342,027, the PROM 33 is implemented to perform the following operation each time it is addressed by a new composite input address $(D_{j-1}, R_{j-1})$:

$$(r_1 R_{j-1} + D_{j-1})_{r2} \rightarrow (Q_j R_j)_{r2} \qquad (2)$$

As shown in equation (2) the previous remainder field $R_{j-1}$ is used as a multiplier, the radix $r_1$ is used as the multiplicand of $R_{j-1}$ and the previous dividend field $D_{j-1}$ is used as an addend which is added to the product $r_1 R_{j-1}$. All of the arithmetic within the parenthesis on the left-hand side of equation (2) is done for the new radix $r_2$ in the arithmetic of the old radix $r_1$. Expressing the quantity within the parenthesis on the left-hand side of equation (2) in the base of radix $r_2$ is equivalent to division by $r_2$. This operation of equation (2) thus produces the result on the right-hand side of the equation, in which $Q_j$ is the present quotient field and $R_j$ is the present remainder field from such division of the quantity within the parenthesis on the left-hand side of equation (2) by the radix $r_2$.

As a practical matter the $r_1$ and $r_2$ signals force the PROM 33 to use the specific set of look-up tables in which the multiplicand$=r_1$ and in which the arithmetic is accomplished in radix $r_2$. The composite input address $(D_{j-1} R_{j-1})$ then addresses the selected specific set of look-up tables to produce a composite output signal comprised of the associated quotient field $Q_j$ and remainder field $R_j$. For example, assume $r_1=8$, $r_2=3$, $R_{j-1}=2$ and $D_{j-1}=5$. In this example the PROM 33 would use the particular set of look-up tables in which $r_1=8$ and $r_2=3$ to develop a binary coded output which is equal to $70_3$ (or 111 000). The output $70_3$ is the same as $7\times 3^1 + 0\times 3^0$. In other words, the field 7 (111) is the quotient field $Q_j$ and the field 0 (000) is the remainder field $R_j$. By referring back to equation (2) it can be readily seen that $(8\times 2+5)_3=(70,0)_3$.

The $Q_j$ and $R_j$ portions of each output of PROM 33 are respectively clocked into quotient (Q) register 37 and the remainder (R) register 35 on the following clock. An AND gate 39 is enabled by the CNV gate to pass clocks to the registers 35 and 37. Note that the PROM 33, registers 37 and 35 and AND gate 39 collectively comprise a processor 40.

The $Q_j$ and $R_j$ fields that are respectively applied to the inputs of registers 37 and 35 appear one clock later at the outputs of those registers as $Q_{j-1}$ and $R_{j-1}$ fields respectively. As mentioned before, the $R_{j-1}$ field from register 35 is used as the multiplier input to PROM 33. This $R_{j-1}$ field is also applied to the input of an output register 41 (to be discussed), which register 41 stores selected ones of the remainder fields $R_{j-1}$ as the fields in the output converted number. The $Q_{j-1}$ field from register 37 is applied to the lower input of multiplexer 11 and to an OR gate 43.

It should be noted at this time that a read only memory (ROM) 45 is addressed by a composite address, comprised of the $r_1$ and $r_2$ signals, to develop $Fr_1$ and $Fr_2$ multi-bit enabling signals from look-up tables. The multi-bit states of the $Fr_1$ signal are determined by the field bit width of the input number which is in radix $r_1$. On the other hand, the multi-bit states of the $Fr_2$ signal are determined by the field bit width of the output number which is to be in radix $r_2$. The above-described Table I illustrates field bit widths correlated to various radices. Table II below correlates exemplary field bit widths to the multi-bit states of an Fr signal ($Fr_1$ or $Fr_2$).

TABLE II

| Field Bit Width | Multi-bit States of an Fr signal |
| --- | --- |
| 1 | 0001 |
| 2 | 0011 |
| 3 | 0111 |
| 4 | 1111 |

The $Fr_1$ and $Fr_2$ signals are applied to the registers 37 and 35, respectively. The $Fr_1$ signal causes the field bit width of the register 37 to conform to the field bit width of the $Q_j$ signal (which is equal to the field bit width of the input number) by only enabling predetermined flip-flops (not shown) of the register 37 as a function of the multi-bit states of the $Fr_1$ signal. In a like manner, the $Fr_2$ signal causes the field bit width of the register 35 to conform to the field bit width of the $R_j$ signal (which is equal to the field bit width of the output number) by only enabling predetermined flip-flops (not shown) of the register 35 as a function of the multi-bit states of the $Fr_2$ signal. Any of the flip-flops in the registers 37 and 35 that are not enabled by 1-state bits in the $Fr_1$ and $Fr_2$ signals remain in their reset conditions to respectively develop 0-state outputs during a radix conversion operation.

It will be recalled that when a CNV gate is applied to the multiplexer 11, the multiplexer switches to its lower input path. Thus, at each clock time the $Q_{j-1}$ quotient field from Q register 37 is passed through multiplexer 11 and through the output path of multiplexer 13 that is selected by the signal $N_1$, and stored in the bank of input register 15 that is associated with the selected output path. Each time that a new $Q_{j-1}$ field from Q register 37 is stored in input shift register 15, a shifting operation occurs in register 15 so that a previously stored field is shifted out of bank 1 of input register 15 and applied as an input dividend field $D_{j-1}$ to the addend input of PROM 33. At the same time, the remainder field $R_{j-1}$ is clocked out of R register 35 and applied to the multiplier input of PROM 33. Thus, as discussed before, at each clock time the dividend $(D_{j-1})$ and remainder $(R_{j-1})$ fields together form a new composite input address $(D_{j-1}, R_{j-1})$ which enables the PROM 33 to perform the operation indicated by equation (2). By means of this operation, at each clock time the PROM 33 develops a new quotient field $Q_j$ and a new remainder field $R_j$ which are respectively stored in the registers 37 and 35 on the next clock.

It should be noted at this time that, in a complete radix conversion operation, it takes one cycle of radix conversion operation to develop each field in the output converted number, and that each cycle is $N_1+1$ clock periods long, where $N_1=$the number of fields in the input number to be converted. Consequently, each field of the output converted number is developed and stored in the output register 41 during an associated cycle of operation. It should be further noted that the number of cycles in a complete radix conversion operation is equal to the number of fields in the output converted number. Therefore, for example, if the system is to convert input BCD number $1389_{10}$ to its binary equivalent $(10101101101_2)$, each cycle would be 5 clock periods long ($N_1+1$) since $N_1$ would be 4 fields in length, and there would be eleven cycles of operation.

Each quotient field $Q_{j-1}$ that is applied to the multiplexer 11 is also applied to the OR gate 43. The output of OR gate 43 is applied to the set (S) input of RS cycle monitor flip-flop 47. During a radix conversion operation the flip-flop 47 is in a reset state, which causes the flip-flop 47 to develop a 0-state signal at its "0" output side.

The flip-flop 47 is reset as a consequence of the "start store" signal. More particularly, the "start store" signal is also applied through an OR gate 49 to the input of a D flip-flop 51. On the following clock the flip-flop 51 develops a "reset" pulse which resets Q register 37, R register 35, cycle length counter 31 and cycle monitor flip-flop 47 to "0" outputs. This reset pulse is also applied to the count input of a reset counter 53 and to one input of an AND gate 59. On the following clock after the termination of the "start store" signal, the flip-flop 51 changes its output state, thereby terminating the reset pulse. It can therefore be seen that at the start of a conversion operation the cycle monitor flip-flop 47 is in a reset state. It should also be noted that the "end store"

signal is used to reset the reset counter 53 to a "0" output count. This reset counter 53 (to be explained) is used to count subsequent reset pulses that occur during a conversion operation in order to determine the total number of fields ($N_2$) in the output converted number that will ultimately be stored in output register 41.

The purpose of the OR gate 43 and flip-flop 47, in combination, is to monitor all of the quotient fields $Q_{j-1}$ that occur during each cycle of a radix conversion operation to provide a signal indication at the end of that cycle as to whether or not the conversion operation is complete. More particularly, if at the end of a cycle the cycle monitor flip-flop 47 is still in a reset state, the conversion operation is complete. On the other hand, if at the end of a cycle of operation, the flip-flop 47 is in a set state, the conversion operation is not complete and at least one more cycle of operation will occur. This operation is explained more fully below.

As stated before, each quotient field $Q_{j-1}$ from register 37 is applied to both the multiplexer 11 and OR gate 43. If at least one bit in any of the multibit-wide quotient fields ($Q_{j-1}$) that occur during a given cycle is in a binary 1-state, the OR gate 43 develops a 1-state signal which sets the cycle monitor flip-flop 47. When set, the flip-flop 47 develops a 1-state signal at its "0" output terminal. This 1-state signal from flip flop 47 is applied to one input of an AND gate 55 to enable that AND gate 55, and is also applied to an inverting input of an AND gate 57 to disable that AND gate 57. The output of the cycle length counter 31 is applied to second inputs of the AND gates 55 and 57. During each cycle the counter 31 counts clocks. Internally the counter 31 has a comparator (not shown) to which the internal count and the number $N_1$ are applied. When the internal count reaches $N_1$ the comparator develops a 1-state "count=$N_1$" signal which is applied to the second inputs of the AND gates 55 and 57. Since the AND gate 57 is disabled by the 1-state output from flip-flop 57, the gate 57 develops a 0-state output. However, the "count=$N_1$" signal is passed through the enabled AND gate 55 to a second input of the OR gate 49. The 1-state "count=$N_1$" signal is therefore applied through the OR gate to the input of the D flip-flop 51. One clock later ($N_1$+1 clock) this 1-state input is clocked out of the flip-flop 51 as a reset pulse. This reset pulse, as stated before, is used to reset the Q register 37, R register 35, cycle length counter 31 and cycle monitor flip-flop 47 to "0" outputs and to count up the reset counter 53 by one on a count of $N_1$+1 clocks after the start of a cycle of operation. This reset pulse is also used to enable the AND gate 59 to pass a clock pulse to the clock input of output register 41. By this means the register 41 is enabled to store the $R_{j-1}$ remainder field being applied to the input of register 41 at that time. Each time that the flip-flop 47 is in a set state at the end of a cycle, a reset pulse is generated and the conversion system goes through another cycle of operation.

If all of the bits in each of the $N_1$+1 quotient fields ($Q_{j-1}$), that occur during a cycle of conversion operation, are binary 0's, then the OR gate 43 will not develop a 1-state output and the cycle monitor flip-flop 47 will still be in a reset state at the time that the cycle length counter 31 has counted $N_1$ clocks and generated a 1-state "count=$N_1$" signal. In this case, the 0-state output of flip-flop 47 disables the AND gate 55 and enables the AND gate 57 to pass the "count=$N_1$" signal to the input of a D-flip-flop 61 and also through the OR gate 49 to the input of the D-flip-flop 51. One clock later, at the time of the $N_1$+1 clock, the 1-state "count=$N_1$" signal is clocked out of the flip-flops 51 and 61 as reset and END CNV signals, respectively.

The reset signal resets the registers 37 and 35, counter 31 and flip-flop 47 to "0" outputs, enables the AND gate 59 to pass a clock to the output register 41 so that the register 41 can store the $R_{j-1}$ remainder field applied thereto, and counts up the reset counter by one to indicate the total number of fields in the output converted number stored in register 41. This particular $R_{j-1}$ field, being stored during this cycle, is the last and most significant field of the output converted number that is stored in the register 41.

The END CNV signal resets the flip-flop 27 to terminate the CNV gate and, hence, terminates the conversion operation. Consequently, no more clocks can be passed through AND gate 29 to clock fields into and out of input register 15.

At the end of a radix conversion operation, the output converted number is stored in the output register 41 and the reset counter 53 indicates the total number of fields in the output converted number stored in the register 41.

Referring now to FIGS. 2A, 2B, 2C and 2D a BCD-to-Binary chart is illustrated for the radix conversion of an exemplary four field long BCD number $1389_{10}$ (0001 0011 1000 1001) into its equivalent output converted binary number ($10101101101_2$). Hence, in relation to the Table of FIG. 2 $r=10$ and $r_2=2$. Note that there are 4 ($N_1$) fields in the input number; with each input field being four (4) bits wide. Therefore, as shown in FIG. 2, each cycle is 5 cycle clock periods long ($N_1$+1). Further note, as also shown in FIGS. 2A, 2B, 2C and 2D, that there are eleven fields in the output converted number and, therefore, eleven cycles of operation, with each field in the output converted number being one (1) bit wide.

The chart in FIGS. 2A, 2B, 2C and 2D illustrates numbers resulting from the various conversion operations performed by the circuits shown in FIGS. 1A and 1B before and during a conversion operation. Cycle "0" shows the static states of the circuits of FIGS. 1A and 1B after a stored operation ends but just before a conversion operation begins, while cycles 1 through 11 show the numbers resulting from the various conversion operations performed by the indicated circuits of FIG. 1 during the conversion operation. As a result, FIGS. 1A and 1B and FIGS. 2A, 2B, 2C and 2D should be referred to.

For purposes of this discussion, each separate digit in the numbers shown in the columns designated "Input Reg. 15", "$D_{j-1}$", "$Q_j$" and "$Q_{j-1}$" represents the value of a four-bit wide field in hexadecimal notation. Also, each separate digit shown in the columns designated "$R_{j-1}$", "$R_j$" and "Output Reg. 41" represents the binary value of a one (1) bit wide field.

CYCLE 0

After the store operation, but before the conversion operation, no clocks are applied to OR gate 23. As a result, the BCD input number 1389, which was stored in input register 15 during the store operation, remains unchanged. The arrow shown in the "Input Reg.15" column shows the sequence that the fields of the input number 1389 are shifted into and out of the input register 15. Note that the most significant field (1) stored in register 15 is applied as the value of the addend $D_{j-1}$ to the PROM 33 at this time. Since no clocks have occurred since the registers 35 and 37 were reset by the reset pulse derived from the "START STORE" pulse, the registers 35 and 37 have "0" outputs at this time. The "0" output from R register 35 is applied as the value of the multiplier $R_{j-1}$ to PROM 33 at this time. Even though the PROM 33 has "0" and "1" inputs at this time, it develops no outputs before the conversion operation is begun by the CNV gate from flip-flop 27.

As shown FIGS. 2A, 2B, 2C and 2D, the CNV gate, which is asynchronously derived by flip-flop 27 from the "START CNV" pulse, begins before the AND gate 29 passes any clocks. Thus, after the CNV gate begins but before a clock is passed by gate 29, the PROM develops $Q_j$ and $R_j$ outputs of "0" and "1", respectively, in the manner previously discussed. These "0" and "1" outputs from PROM 33 are respectively applied to the inputs of registers 37 and 35, but not clocked into these registers because no clocks have occurred yet.

CYCLE 1

It will be recalled that in operation there are $N_1+1$ clocks per cycle of operation, that there are $N_2$ fields in the output converted number with one field being developed during each cycle of operation, and that, in relation to the Table of FIGS. 2A, 2B, 2C and 2D, $r_1=10$ and $r_2=2$.

During the first cycle clock period of cycle 1 several circuit operations occur. Input register 15 is enabled by a clock passing through AND gate 29 and OR gate 23 to shift out one field and apply the next field (=3) as a $D_{j-1}$ field to the addend input of the PROM 33. The prior $Q_{j-1}$ output (=0) of register 37 is applied through OR gate 43 to the set input of flip-flop 47. Since this $Q_{j-1}$ output =0, the flip flop 47 remains in its reset state. The prior $Q_{j-1\ output\ (=0)}$ is also applied through multiplexers 11 and 13 and stored in input register 15. Note that in the column "Input Reg. 15", this "0" output is stored in register 15 as a new field immediately behind the fields 3, 8 and 9. The prior $Q_j$ (=0) and $R_j$ (=1) input fields to registers 37 and 35 are now respectively stored in registers 37 and 35 and appear at the outputs of these registers as the $Q_{j-1}$ (=0) and $R_{j-1}$ (=1) fields, respectively. The $R_{j-1}$ field (=1) from register 35 and the $D_{j-1}$ field (=3) from register 15 are respectively applied to the multiplier and addend inputs of PROM 33. In response to these two new inputs the PROM 33 performs the mathematical operation shown in equation 2 (and previously discussed) to develop $Q_j$ and $R_j$ outputs equal to 6 and 1, respectively.

The operation the radix conversion system of FIGS. 1A and 1B during the remaining four cycle clock periods of cycle 1 is similar to that described in relation to the first cycle clock period of cycle 1. Note that, during cycle clock period 4, the $R_{j-1}$ *field from register 35 is equal to* 1 and is shown boxed. This $R_{j-1}$ field, which is also applied to the input of output register 41, is clocked into output register 41, during the cycle clock period 5 by cycle clock 5, which clock passes through the AND gate 59 that is enabled by the reset signal at its other input. This $R_{j-1}$ field (=1), which is clocked into output register 41 during the last clock of cycle 1, is the least significant field in the output converted number that is ultimately stored in register 41 at the end of the conversion operation.

CYCLES 2 THROUGH 11

The operation of the radix conversion system of FIGS. 1A and 1B during each of cycles 2 through 11 is similar to that described in relation to cycle 1. Each boxed value of $R_{j-1}$ that is developed during cycle clock period 4 of any of cycles 2 through 11 is the value of the output converted field for that cycle that is stored in output register 41 during the fifth cycle clock period of that cycle. The significance of each of the fields that are ultimately stored in register 41 increases as a direct function of the cycle number. Thus, as shown in the column "Output Reg. 41", the field stored in register 41 during cycle 1 is the least significant field while the field stored in register 41 during cycle 11 is the most significant field of the output converted number.

Note that during each of the cycles 1 through 10, at least one of the five $Q_{j-1}$ *values developed during a cycle has a value which is not equal to zero* (0). As a consequence, at the end of each of cycles 1 through 10, the cycle monitor flip-flop 47 is in a set state, thereby preventing the generation of an END CNV signal by disabling the AND gate 57, and also allowing one more cycle of operation by enabling the AND gate 55. However, during cycle 11, everyone of the five $Q_{j-1}$ values (shown boxed) is equal to zero (0). As a result, the cycle monitor flip-flop 47 is still in a reset state when the "count=$N_1$" pulse is generated by the counter 31. As discussed before, this "count=$N_1$" passes through enabled gate 57 to the input of flip-flop 61. One clock later (on the $N_1+1$ clock of cycle 11) the flip-flop 61 generates an END CNV pulse to reset flip-flop 27 and terminate the conversion operatio terminating the CNV gate.

Referring now to FIGS. 3A, 3B, 3C and 3D, a Binary-to-BCD chart is illustrated for radix conversion of an exemplary eleven field long binary number $10101101101_2$ into its equivalent output converted BCD number $1389_{10}$ (0001 0011 1000 1001). In this case, the input number is eleven fields long with each field being one (1) bit wide, there are 4 cycles of operation with each cycle being 12 cycle clock periods long (=$N_1+1$, where $N_1=11$), the output converted number is 4 fields long with each field being 4-bits wide, $r_1=2$, and $r_2=10$.

The operation of the system of FIGS. 1A and 1B for the conversion operation shown in FIGS. 3A, 3B and 3C and 3D is similar to that for the conversion operation shown in FIGS. 2A, 2B, 2C and 2D. The PROM 33 will use different look-up tables since now $r_1=2$, and $r_2=10$. Otherwise, the circuit operation is the same.

In a like manner, by storing appropriate look-up tables in the PROM 33, the system of FIGS. 1A and 1B capable of converting an input number in any given first radix $r_1$ into its equivalent number in any given other radix $r_2$.

The invention thus provides, as disclosed in the illustrated embodiment, a system for converting an input number in a first radix $r_1$ into its equivalent output number in a second radix $r_2$. The same signal flow and structure is used for any desired radix conversion operation.

While the salient features have been illustrated and described in a preferred embodiment of the invention, it should be readily apparent to those skilled in the art that many changes and modifications can be made in the preferred embodiment without departing from the spirit and scope of the invention. For example, different types of memory and storage devices could be used. Also the system of FIGS. 1A and 1B can be readily modified to increase the speed in a radix conversion operation by, for example, coupling in sequence one or more processors like the processor 40 to the output of Q register 37, coupling the output of the equivalent processor 37 in the last processor in the chain back to the multiplexer 11 and OR gate 43 combination and applying the $R_{j-1}$ outputs from each of the processors in the chain of processors by way of suitable coupling, delay or time division multiplexing circuits to the output register 41 for selective storage therein. It is therefore intended to cover all such changes and modifications of the invention that fall within the spirit and scope of the invention as set forth in the appended claims.

What is claimed is:

1. Automatic apparatus for selectively converting a variable length input number in any one of a plurality of different radices and having a predetermined number of fields into an equivalent output number in any one of a plurality of different radices comprising:

input means providing binary electrical input number signals representing said input number, a length signal $N_1$ indicating the number of fields in said input number, a radix signal $r_1$ indicating the radix $r_1$ of said input number, and a radix signal $r_2$ indicating the radix $r_2$ to which said input number is to be converted;

means for grouping said input number signals into a number of groups of binary signals in response to said length signal $N_1$, each group representing a field of said input number; and conversion means to which said groups are applied;

said conversion means including a memory responsive to said groups as well as to said radix signals $r_1$ and $r_2$, said memory producing memory output signals having values determined by the conversion indicated by said radix signals $r_1$ and $r_2$;

said conversion means also including means responsive to said memory output signals for producing binary output signals representing said equivalent output number in the radix $r_2$;

said conversion means further including means responsive to said length signal $N_1$ for automatically terminating the conversion opertion after the conversion of a number of said groups of signals corresponding to the number of fields of said input number has been completed.

2. The invention in accordance with claim 1, wherein said memory contains different sets of tables respectively corresponding to different radix conversion, and wherein said memory is responsive to said radix signals $r_1$ and $r_2$ for selecting a particular set of tables to be used for producing said memory output signals in response to said groups applied thereto.

3. The invention in accordance with claim 1 or 2, wherein said conversion means performs serial division on said groups by causing said memory to successively perform a plurality of operations, each operation being represented by the relationships:

$$(r_1R_{j-1}+D_{j-1})r_2 \rightarrow (Q_j, R_j)r_2$$

wherein $r_1$ and $r_2$ have values determined by said radix signals $r_1$ and $r_2$, $D_{j-1}$ has a value determined by signals applied to said memory, $R_{j-1}$ represents the value of a remainder produced by said memory during a previous operation, and $Q_j$ and $R_j$ respectively represent the values of a quotient and a remainder produced by said memory during a current operation.

4. The invention in accordance with claim 3, wherein said conversion means also includes means for successively applying signals corresponding to previously produced quotients and remainders to said memory.

5. The invention in accordance with claim 3, wherein said conversion means includes means for delaying each remainder $R_j$ produced by said memory during an operation so as to provide a remainder $R_{j-1}$ for use as an input to said memory for the next operation.

6. The invention in accordance with claim 3, including means for selecting particular ones of said remainders as memory output signals for application to said means responsive to said memory output signals for producing said binary output signals representing said equivalent output number.

7. The invention in accordance with claim 3, wherein said means responsive to said length signal $N_1$ operates to terminate the conversion by monitoring the values of the quotients produced by said programmable read only memory.

8. Automatic apparatus for selectively converting a variable length input number in any one of a plurality of different radices into an equivalent output number in any one of a plurality of different radices comprising:

input means providing binary electrical input signals representing said input number, its length $N_1$, its radix $r_1$, and the radix $r_2$ to which the input number is to be converted;

said input means including means responsive to said binary electrical input signals for providing said input number in the form of a predetermined number of fields wherein each field has a predetermined bit width whose value is a function of the radix $r_1$ of the input number, and wherein said predetermined number of fields is a function of the input number length $N_1$; and conversion means to which said predetermined number of fields of said input number are serially applied;

said conversion means being responsive to both of said radices $r_1$ and $r_2$ as well as to the serially applied predetermined number of fields of the input number for producing binary output signals having an appropriate number of fields with appropriate bit width for representing said equivalent output number in the radix $r_2$;

said conversion means also including means responsive to $N_1$ for automatically terminating the conversion operation after the conversion of the said predetermined number of fields of said input number into said output number has been completed.

9. The invention in accordance with claim 8, wherein said conversion means includes at least one programmable read only memory to which the fields of the input number are serially applied for performing the desired radix conversion, said memory having different sets of tables respectively corresponding to a different radix conversions, and wherein said programmable read only memory is responsive to $r_1$ and $r_2$ for selecting a particular set of tables to be used for converting the fields of an applied input number.

* * * * *

UNITED STATES PATENT AND TRADEMARK OFFICE
CERTIFICATE OF CORRECTION

PATENT NO. : 4,570,056
DATED     : February 11, 1986
INVENTOR(S) : Lawrence G. Hanson It is certified that error appears in the above-identified patent and that said Letters Patent is hereby corrected as shown below:

```
Col.  1, line  8, change "paten" to --patent--.
Col.  2, line 17, change "eac" to --each--.
Col.  5, line 49, change "(F_r or Fr_2)." to --(Fr_1 or Fr_2).--.
Col.  8, line 29, change "r = 10" to --r_1 = 10--;
         line 43, change "stored" to --store--.
Col.  9, line  9, after "shown" insert --in--.
Col. 10, line 29, change "operatio" to --operation--;
         line 48, before "capable" insert --is--.
Col. 11, line 40, change "opertion" to --operation--;
         line 46, change "conversion," to --conversions,--;
         line 55, change "relationships:" to
                         --relationship:--.
```

Signed and Sealed this

Twenty-ninth Day of July 1986

[SEAL]

Attest:

DONALD J. QUIGG

Attesting Officer

Commissioner of Patents and Trademarks